United States Patent [19]
Fisher et al.

[11] Patent Number: 5,869,952
[45] Date of Patent: Feb. 9, 1999

[54] BATTERY CHARGE INDICATOR HAVING IMPROVED RESOLUTION

[75] Inventors: Curtis William Fisher; Einar Trygstad, both of Sterling, Ill.

[73] Assignee: Wahl Clipper Corporation, Sterling, Ill.

[21] Appl. No.: 908,490

[22] Filed: Aug. 7, 1997

[51] Int. Cl.⁶ .......................... H02J 7/00; G01N 27/416; H01M 10/48
[52] U.S. Cl. ................... 320/136; 320/DIG. 21; 324/435; 429/93
[58] Field of Search .................... 320/135, 136, 320/DIG. 21; 324/435; 429/90, 91, 92, 93

[56] References Cited

U.S. PATENT DOCUMENTS

| | | |
|---|---|---|
| 4,737,020 | 4/1988 | Parker . |
| 4,835,475 | 5/1989 | Hanakura et al. . |
| 5,059,895 | 10/1991 | Cataldi et al. . |
| 5,231,356 | 7/1993 | Parker . |
| 5,389,470 | 2/1995 | Parker et al. . |
| 5,460,902 | 10/1995 | Parker et al. . |
| 5,491,420 | 2/1996 | Parker . |
| 5,600,231 | 2/1997 | Parker . |
| 5,600,281 | 2/1997 | Parker ..................................... 320/136 |
| 5,610,511 | 3/1997 | Parker ..................................... 324/435 |
| 5,672,440 | 9/1997 | Bailey ....................................... 429/93 |

*Primary Examiner*—Peter S. Wong
*Attorney, Agent, or Firm*—Greer, Burns & Crain, Ltd.

[57] ABSTRACT

Apparatus indicates a charge on a battery that has a predetermined operating range. The apparatus includes a thermochromatic material for displaying the charge level of the battery, and a resistive heating device, which is in thermal contact with the thermochromatic material, for generating heat for activating the thermochromatic material. A controlling device which is connected to the resistive heating device is also included for controlling the heat generated by the heating device so that the thermochromatic material has sufficient resolution to indicate the charge on the battery over a substantial portion of the thermochromatic material.

12 Claims, 1 Drawing Sheet

BATTERY CHARGE INDICATOR HAVING IMPROVED RESOLUTION

This invention relates generally to apparatus for indicating a charge on a battery by measuring the voltage of the battery, and more particularly, to apparatus for indicating a charge on a battery with high resolution when a display is used which would not have sufficient resolution if the display were connected directly to the battery terminals.

BACKGROUND OF THE INVENTION

Many battery charge indicators employ a thermochromatic material as the display or meter for indicating the relative charge on a battery. These indicators have been integrated into the packaging of batteries and have even been mounted directly on the batteries themselves. In this type of battery charge indicator, thermochromatic ink is applied over a tapered resistive strip that produces heat when the battery voltage is applied to the resistive strip, causing the current to flow through the strip. The heat causes the thermochromatic ink to react by becoming clear and revealing an underlying graph to give a visual indication of the charge on the battery.

These indicators generally work well to display the charge on a batter which has a relatively wide operating voltage range, for example, approximately 0.5 V or more, and they can be connected directly to the battery terminals. Alkaline batteries or series packs of three or more nickel-cadmium (Ni—Cd) batteries have a sufficiently wide operating voltage range such that the changes in the voltage level as the battery is discharged or charged is adequately displayed on the thermochromatic material. In other words, the variation of voltage from one end of the range to the other is sufficiently wide so that the thermochromatic ink in the thermochromatic indicator reveals the underlying graph over a substantial portion of the thermochromatic material.

However, for batteries such as a single rechargeable Ni—Cd battery or a nickel metal hydride battery which have a relatively small or narrow operating voltage range between fully charged and discharged conditions, normally about 0.2 V, the conventional thermochromatic indicators connected directly to the battery terminals have been unable to indicate the battery charge level with adequate resolution. The portion, of the thermochromatic ink affected by the change in the battery voltage from one end of the operating range to another is only a fraction of the entire thermochromatic material. Therefore, an incremental or a decremental change in the battery voltage is too small to significantly vary the current through the resistive strip. This results in a correspondingly small change in the heat produced by the resistive strip and similarly negligible portion of the thermochromatic material being affected by the change. Consequently, the variation in the battery charge level is almost indistinguishable to a user viewing the thermochromatic material for the purposes of determining the charge on the battery because of poor resolution.

Thus, there is a need for apparatus for indicating a charge with good resolution when the battery has a relatively small operating voltage range between the charged and discharged conditions.

Accordingly, one object of this invention is to provide a new and improved battery charge indicator.

Another object is to provide a new and improved battery charge indicator having high resolution when the battery has a relatively small voltage range between the charged and discharged conditions.

BRIEF SUMMARY OF THE INVENTION

In keeping with one aspect of this invention, apparatus indicates a charge on a battery which has a voltage range between the charged and discharged conditions. The apparatus includes a thermochromatic material for displaying the charge level of the battery, and a resistive heating device, which is in thermal contact with the thermochromatic material, for generating heat and activating the thermochromatic material. A controlling device is connected to the resistive heating device for controlling the heat generated by the heating device so that the thermochromatic material has sufficient resolution to differentiate between charged and discharged conditions of the battery over a substantial portion of the thermochromatic material.

According to another aspect of this invention, apparatus indicates a charge on a battery having a predetermined operating range, and includes for displaying the charge level of the battery based on a rate of current flow through the display device. A controller is also included and is connected to the display device for controlling the current flow through the display device so that the display device has sufficient resolution to indicate the charge on the battery over a substantial portion of the display device. With the controller, the charge level of batteries having a relatively small operating voltage range is indicated over a substantial portion of the display or meter of the apparatus.

BRIEF DESCRIPTION OF THE DRAWINGS

The above-mentioned and other features of this invention and the manner of obtaining them will become more apparent, and will be best understood by reference to the following description, taken in conjunction with the accompanying drawings in which.

DETAILED DESCRIPTION

Figure 1:
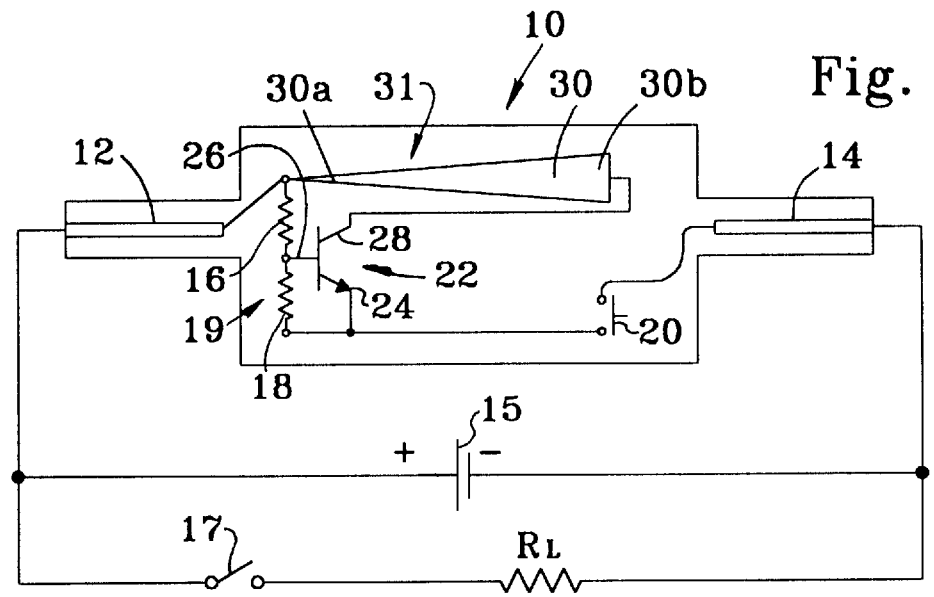
FIG. 1 is a schematic diagram of one embodiment of the present invention.

As seen in FIG. 1, one embodiment of the battery charge indicator of the present invention, indicated generally at 10, includes two leads 12, 14 which are connected respectively to the positive and negative terminals of a battery 15. The battery terminals are also connected to a load $R_L$ through a switch 17.

The load $R_L$ could be a shaver motor or other motor, an electronic device or the like. Generally, the charge on the battery is determined by measuring the battery voltage under no load conditions, with the switch 17 off and the load $R_L$ inoperative. However, the voltage can be measured under load conditions, as well.

A pair of resistors 16, 18 are series connected between the positive lead 12 and a switch 20, which is also connected to the negative lead 14. When depressed by a user, the switch 20 completes the circuit between the positive and the negative terminal of the battery 15, and when released by the user the circuit is disconnected. In the preferred embodiment, the switch 20 is a membrane switch, but it is contemplated that other types of switches may also be suitable.

Arranged as described above, the two resistors 16, 18 form a voltage divider circuit 19 that divides the battery voltage according to the resistance of each resistor. As such, the proportionally divided voltage varies linearly with the variations in the voltage level of the battery 15, and therefore, the changes in the battery voltage level are similarly reflected in the divided voltage. The divided voltage appears between the two resistors 16, 18 and is input to a transistor 22, such as a 2N4401 transistor. The transistor 22 has an emitter 24 commonly connected to the resistor 18 and the negative terminal of the battery 15 (when the switch 20 is closed), a base 26 connected between the resistors 16, 18, and a collector 28 connected to one end of a resistive heater 30, which is adapted to produce heat when current flows through it. The other end of the resistive heater 30 is connected to the positive lead 12.

It is now apparent that the transistor 22 and resistors 16, 18 are configured as a common-emitter amplifier 31. In this manner, the amplifier 31 controls the current flow through the heater 30, and thereby controls the heat generated by the heater. Since the voltage input to the base 26 of the amplifier 31 is tied to the voltage level of the battery 15, via the voltage divider circuit 19, the output of the amplifier and thus the heat generated by the heater 30, increases and decreases with the changes in the battery voltage level, which is indicative of the charge on the battery. In effect, the amplifier 31 amplifies the changes in the battery voltage, so that a relatively small change in the battery voltage (e.g., a change of about 0.2 V) causes a significant change in the current through the resistive heating element 30, and a resulting noticeable change in the charge level displayed by the display 36.

The resistive heater 30 has a tapered configuration, with a narrow portion 30a being connected to the positive lead 12 and a broad portion 30b being connected to the collector 28 of the amplifier 31. The tapered configuration allows the heater 30 to produce enough heat first at the narrow end and then gradually to the broad end as the current flow through the heater increases.

Figure 2:
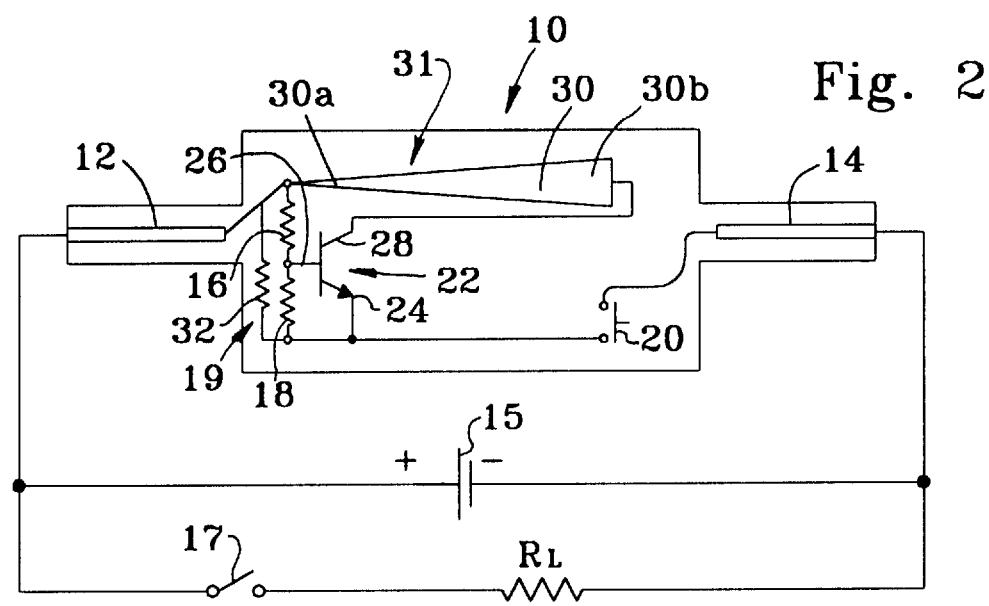
FIG. 2 is a schematic diagram of another embodiment of the present invention.

The values of the resistors 16, 18 are selected based on the operating voltage range of the battery 15 to be tested. Generally, operating voltage range refers to levels of voltage on the battery which are sufficient to operate a load connected to the battery. For example, preferred resistances of the resistors 16, 18 for measuring the charge on a rechargeable Ni—Cd battery having an operating voltage range of approximately 0.2 V (between about 1.4 V and 1.2 V) are 3.6 and 6.8 Ohms, respectively. Preferably, the resistance of the resistive heater 30 should be approximately 2 Ohms. It is contemplated that the heater 30 could have a resistance greater than 2 Ohms, but a load resistor 32 should be added in parallel with the two resistors 16, 18, as shown in FIG. 2, to apply an additional load on the battery 15. For example, with the values of the resistors 16, 18 being the same as described above and the resistance of the heater 30 being 7.5 Ohms, the load resistor 32 should be 3.3 Ohms. With these or similar values, the transistor 22 is biased so that it turns on hard when the battery 15 is filly charged at a voltage of about 1.4 V, and nearly turns off when the voltage of battery is about 1.2 V, which indicates a low charge on the battery.

Figure 3:
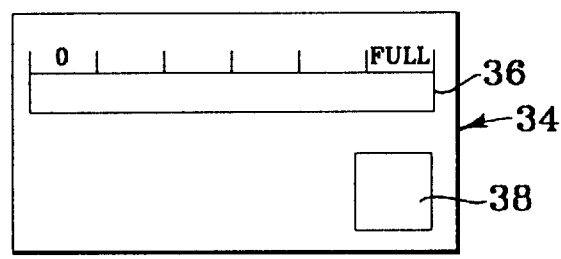
FIG. 3 is a front view of an overlay which is placed over the circuit components shown in FIGS. 1 and 2.

Turning now to FIG. 3, an overlay 34 for the battery charge indicator 10 is shown, and includes a thermochromatic material 36 which holds thermochromatic ink over an underlying graphic chart. The thermochromatic material 36 is configured and positioned on the overlay 34 so as to be placed directly over the resistive heater 30 so that they are in thermal contact with each other substantially along their entire lengths. In this manner, the thermochromatic ink reacts and reveals the graphic chart corresponding to the portion of the resistive heater 30 which is in direct contact with the thermochromatic material 36. The overlay 34 also includes a pad 38 which is adapted to be positioned over the switch 20 for electrically connecting and disconnecting the indicator 10 from the battery 15 when the switch 20 is depressed by the user.

In operation, when the switch 20 is closed by the user depressing the pad 38, the voltage level of the battery 15, which represents the charge level of the battery, is divided by the resistors 16, 18. The divided voltage is input to the transistor 22 which, in effect, regulates the voltage so as to control the current flow through the resistive strip 30, thereby correspondingly controlling the heat generated by the resistive strip 30. The resistive strip 30 then transmits the heat along the length of the thermochromatic material 36. From the reaction of the ink in the thermochromatic material 36, the charge level of the battery is displayed.

An advantage of this invention is that by using the battery voltage as the input to the amplifier 31, the small incremental change in the battery voltage level is amplified to increase the resolution of the thermochromatic material 36. In other words, the amplifier 31 in effect allows the operating voltage range to be represented by a substantial portion of the length of the thermochromatic material 36 rather than by a small portion of it, which would be the result if conventional battery charge indicators were to be employed.

While the principles of the invention have been described above in connection with specific apparatus and applications, it is to be understood that this description is made only by way of example and not as a limitation on the scope of the invention.

What is claimed is:

1. Apparatus for indicating battery charge level over a predetermined operating range, comprising:

a thermochromatic material for displaying the battery charge level; and a resistive heater element, in thermal contact with said thermochromatic material, for heat generation to activate said thermochromatic material;

wherein said resistive heater element is controlled in such a way to amplify changes in battery charge level over the operating range of battery so that said thermochromatic material has sufficient resolution to indicate the battery charge level over a substantial portion of said thermochromatic material.

2. The apparatus as defined in claim 1 wherein said controlling means includes voltage dividing means, connected to the battery, for dividing a voltage level of the battery by a predetermined amount, and means, connected to said voltage dividing means, for using said divided voltage level to vary the voltage across said heating means.

3. The apparatus as defined in claim 2 wherein said voltage dividing means includes a pair of resistors.

4. The apparatus as defined in claim 3 wherein said voltage dividing means includes a third resistor connected in parallel with said pair of resistors.

5. The apparatus as defined in claim 2 wherein said means for using said divided voltage level to vary the voltage across said heating means is a transistor.

6. The apparatus as defined in claim 1 wherein said controlling means is a common-emitter amplifier.

7. The apparatus as defined in claim 1 wherein said heating means is a tapered resistive strip adapted to gradually increase resistance from a first end to a second end.

8. The apparatus as defined in claim 1 further comprising switching means for selectively connecting and disconnecting said controlling means to and from the battery.

9. The apparatus as defined in claim 8 wherein said switching mean is a membrane switch.

10. Apparatus for indicating battery charge level over a predetermined operating range, comprising:

means for displaying the battery charge level based on current flow through a display device, said displaying means amplifying changes in the battery charge level over the operating range, so that said display device has sufficient resolution to indicate the battery charge level over a substantial portion of said display device.

11. The apparatus as defined in claim 10 wherein said controlling means includes voltage dividing means, connected to the battery, for dividing a voltage level of the battery by a predetermined amount, and means connected to said voltage dividing means, for using said divided voltage level to vary the current flow through the displaying means.

12. The apparatus as defined in claim 11 wherein said displaying means includes thermochromatic material.

\* \* \* \* \*